United States Patent [19]
Miyoshi

[11] Patent Number: 6,147,493
[45] Date of Patent: Nov. 14, 2000

[54] MAGNETIC RESONANCE IMAGING METHOD AND APPARATUS

[75] Inventor: Mitsuharu Miyoshi, Tokyo, Japan

[73] Assignee: GE Yokogawa Medical Systems, Limited, Tokyo, Japan

[21] Appl. No.: 09/346,099

[22] Filed: Jul. 1, 1999

[30] Foreign Application Priority Data

Jul. 21, 1998 [JP] Japan .................................. 10-205069

[51] Int. Cl.[7] .................................................. G01V 3/00
[52] U.S. Cl. .......................... 324/312; 324/306; 324/309
[58] Field of Search .................................... 324/312, 306, 324/309

[56] References Cited

U.S. PATENT DOCUMENTS 5,713,358  2/1998  Mistretta et al. ........................ 324/306

Primary Examiner—Christine K. Oda
Assistant Examiner—Brij B. Shrivastav
Attorney, Agent, or Firm—Moonray Kojima

[57] ABSTRACT

In order to provide a magnetic resonance imaging method and apparatus which avoids artifacts due to the motion of a subject when the imaging is conducted with the interval between time phases reduced, a two-dimensional Fourier space is divided into a plurality of regions A,A'–D,D' symmetrically with respect to the frequency axis kx, and data acquisitions for the peripheral regions B and B', C and C', and D and D' are sequentially conducted with the data acquisition for the central regions A and A' interposed each time. At this time, the data acquisition is conducted alternately for each TR in a pair of symmetric regions, thereby minimizing the time difference between symmetric data.

5 Claims, 13 Drawing Sheets

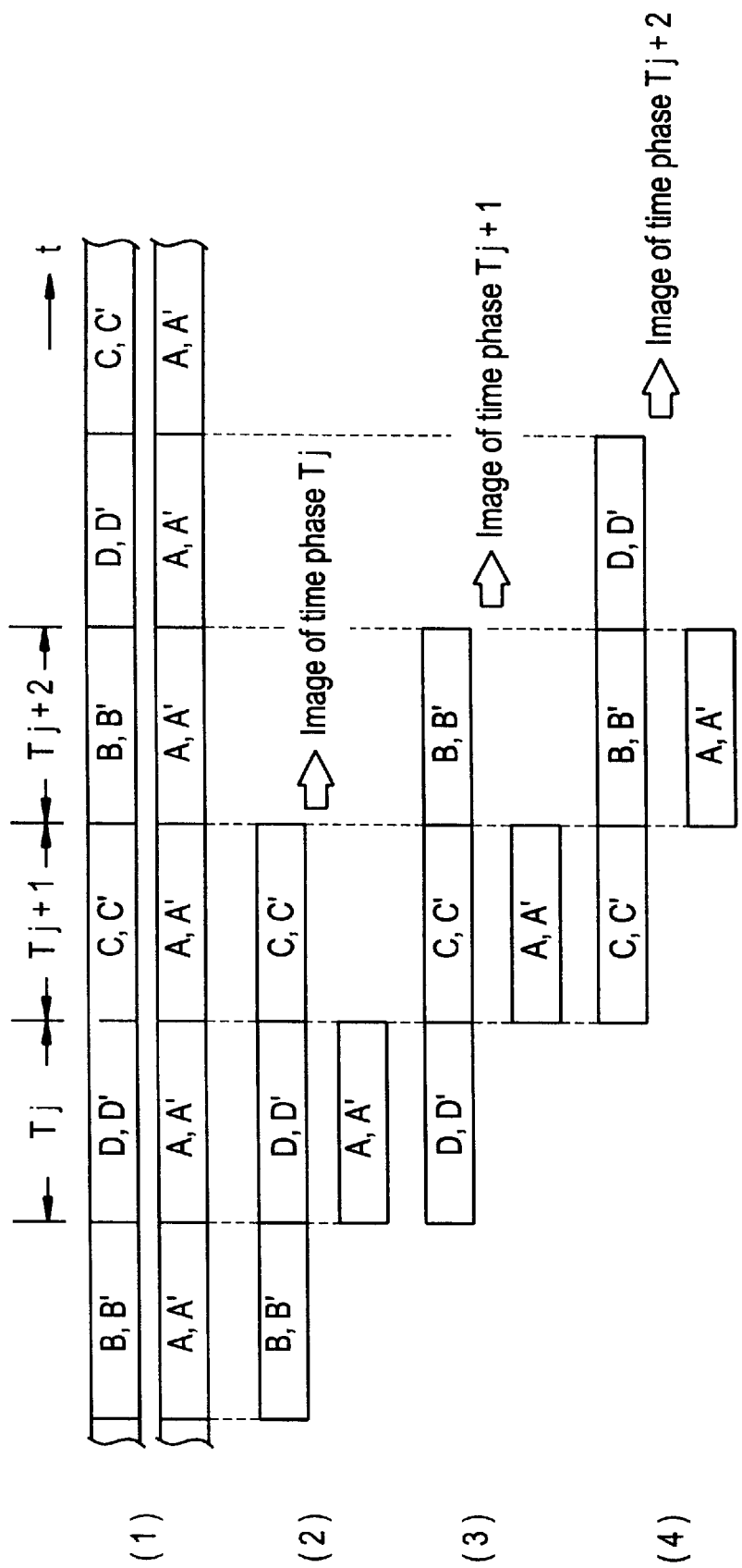

MAGNETIC RESONANCE IMAGING METHOD AND APPARATUS

BACKGROUND OF THE INVENTION

The present invention relates to a magnetic resonance imaging method and apparatus, and more particularly to a magnetic resonance imaging method and apparatus for acquiring data by a pulse sequence which generates a magnetic resonance signal for each TR (repetition time) and reconstructing an image based on the data.

In magnetic resonance imaging, spins within a subject are excited by an excitation pulse for each TR, and a magnetic resonance signal generated by the excitation is acquired as a gradient echo or a spin echo to fill a two-dimensional Fourier space. The magnetic resonance signal is given a different phase encoding for each view, and echo data are acquired for a plurality of views whose positions are different in the phase axis in the two-dimensional Fourier space. The echo data acquired for all views are then two-dimensional inverse Fourier-transformed to reconstruct an image.

In acquiring the echo data, a process is carried out involving: dividing the two-dimensional Fourier space into a central region containing the origin of the phase axis (at which the phase encoding amount is zero) and a range in close proximity to the origin in which the absolute value of the phase encoding amount is small, and peripheral regions on both sides of the central region in which the absolute value of the phase encoding amount is large; conducting data acquisitions so as to fill one peripheral region, the central region and the other peripheral region in order with view data, then conducting data acquisitions so as to fill the central region and the one peripheral region in order with view data, and then conducting data acquisitions so as to fill the central region and the other peripheral region in order with view data; and repeatedly conducting the data acquisition operations, thereby reducing the time interval between the data acquisitions for the central region relative to the time interval between the data acquisitions for each peripheral region.

When such data acquisitions are conducted, the image reconstruction is carried out using a set of data consisting of the data acquired for the central region and the data acquired for the peripheral regions on both sides of the central region. The data of the peripheral regions on both sides used here are the data whose acquisition time periods are nearest to the data acquisition time period of the central region. This causes a plurality of successive images corresponding to the successively updated data for the central region to be reconstructed.

Each reconstructed image indicates the state of the subject (time phase) substantially in a time period in which the data for the central region is acquired. Because the time interval between the data acquisitions for the central region is reduced by the above-described data acquisition process, the images successively reconstructed indicate the time phases of the subject in detail.

According to the data acquisition process, however, since the data acquisitions for those regions are conducted in view number order in a sequential manner, the data acquisition time period of one of the peripheral regions on both sides of the central region is different from that of the other of the peripheral regions. Since these peripheral regions are given the phase encoding amounts having the same absolute values but opposite signs, any motion of the subject impairs symmetry of data as long as the time phase of the data for one peripheral region is different from that for the other peripheral region, and hence, may lead to artifacts in the reconstructed images.

SUMMARY OF THE INVENTION

It is an object of the invention to provide a magnetic resonance imaging method and apparatus which avoids artifacts due to the motion of a subject when the imaging is conducted with the interval between time phases reduced.

In accordance with a first aspect of the invention, there is provided a magnetic resonance imaging method comprising the steps of: dividing a two-dimensional Fourier space into a plurality of regions which are symmetric with respect to a frequency axis which corresponds to a direct current component; repeatedly conducting an alternate acquisition of magnetic resonance signals for a pair of central regions which are symmetric with each other and are nearest to the frequency axis of the plurality of regions, and an alternate acquisition of magnetic resonance signals for a selected one of a plurality of pairs of peripheral regions other than the pair of central regions which are symmetric with each other, with the selected pair of peripheral regions switched in order from one pair to another for each repetition; and sequentially reconstructing an image using a set of magnetic resonance signals consisting of the magnetic resonance signals acquired for the pair of central regions for one of the repetitions and the respective magnetic resonance signals for the plurality of pairs of peripheral regions acquired at respective time points nearest to a data acquisition time point of the pair of central regions for that repetition.

In accordance with a second aspect of the invention, there is provided a magnetic resonance imaging apparatus comprising: region defining means for dividing a two-dimensional Fourier space into a plurality of regions which are symmetric with respect to a frequency axis which corresponds to a direct current component; magnetic resonance signal acquiring means for repeatedly conducting an alternate acquisition of magnetic resonance signals for a pair of central regions which are symmetric with each other and are nearest to the frequency axis of the plurality of regions, and an alternate acquisition of magnetic resonance signals for a selected one of a plurality of pairs of peripheral regions other than the pair of central regions which are symmetric with each other, with the selected pair of peripheral regions switched in order from one pair to another for each repetition; and image reconstructing means for sequentially reconstructing an image using a set of magnetic resonance signals consisting of the magnetic resonance signals acquired for the pair of central regions for one of the repetitions and the respective magnetic resonance signals for the plurality of pairs of peripheral regions acquired at respective time points nearest to a data acquisition time point of the pair of central regions for that repetition.

In accordance with a third aspect of the invention, there is provided the magnetic resonance imaging apparatus as described regarding the second aspect, wherein the magnetic resonance signal acquiring means acquires the magnetic resonance signals at positions which are symmetric with respect to the frequency axis alternately for the pairs of central regions and for the plurality of pairs of peripheral regions.

According to the present invention, magnetic resonance signals are acquired alternately for pairs of regions which are symmetric with each other in a two-dimensional Fourier space, thereby reducing the time difference between view data in each pair of regions. Moreover, the data acquisitions are conducted in order such that the time interval between the data acquisitions for the central regions is shorter than each respective time interval between the data acquisitions for the peripheral regions.

In accordance with a fourth aspect of the invention, there is provided the magnetic resonance imaging apparatus as described regarding any of the second and third aspects, wherein the magnetic resonance signal acquiring means repeatedly conducts an alternate acquisition of magnetic resonance signals for the pair of central regions to acquire all magnetic resonance signals for the pair of central regions, and then conducts an alternate acquisition of magnetic resonance signals for a selected one of the plurality of pairs of peripheral regions to acquire all magnetic resonance signals for the selected pair of peripheral regions.

In accordance with a fifth aspect of the invention, there is provided the magnetic resonance imaging apparatus as described regarding any of the second and third aspects, wherein the magnetic resonance signal acquiring means repeatedly conducts an alternate acquisition of magnetic resonance signals for the pair of central regions and a selected one of the plurality of pairs of peripheral regions to acquire all magnetic resonance signals for the pair of central regions and the selected pair of peripheral regions.

The present invention thus provides a magnetic resonance imaging method and apparatus which avoids artifacts due to the motion of a subject when the imaging is conducted with the interval between time phases reduced.

Further objects and advantages of the present invention will be apparent from the following description of the preferred embodiments of the invention as illustrated in the accompanying drawings.

BRIEF DESCRIPTION THE DRAWINGS

FIG. 6 is a schematic diagram illustrating data acquisitions for the two-dimensional Fourier space by the apparatus.

FIG. 13 is a schematic diagram illustrating image reconstruction by the apparatus.

DETAILED DESCRIPTION OF THE INVENTION

Figure 1:
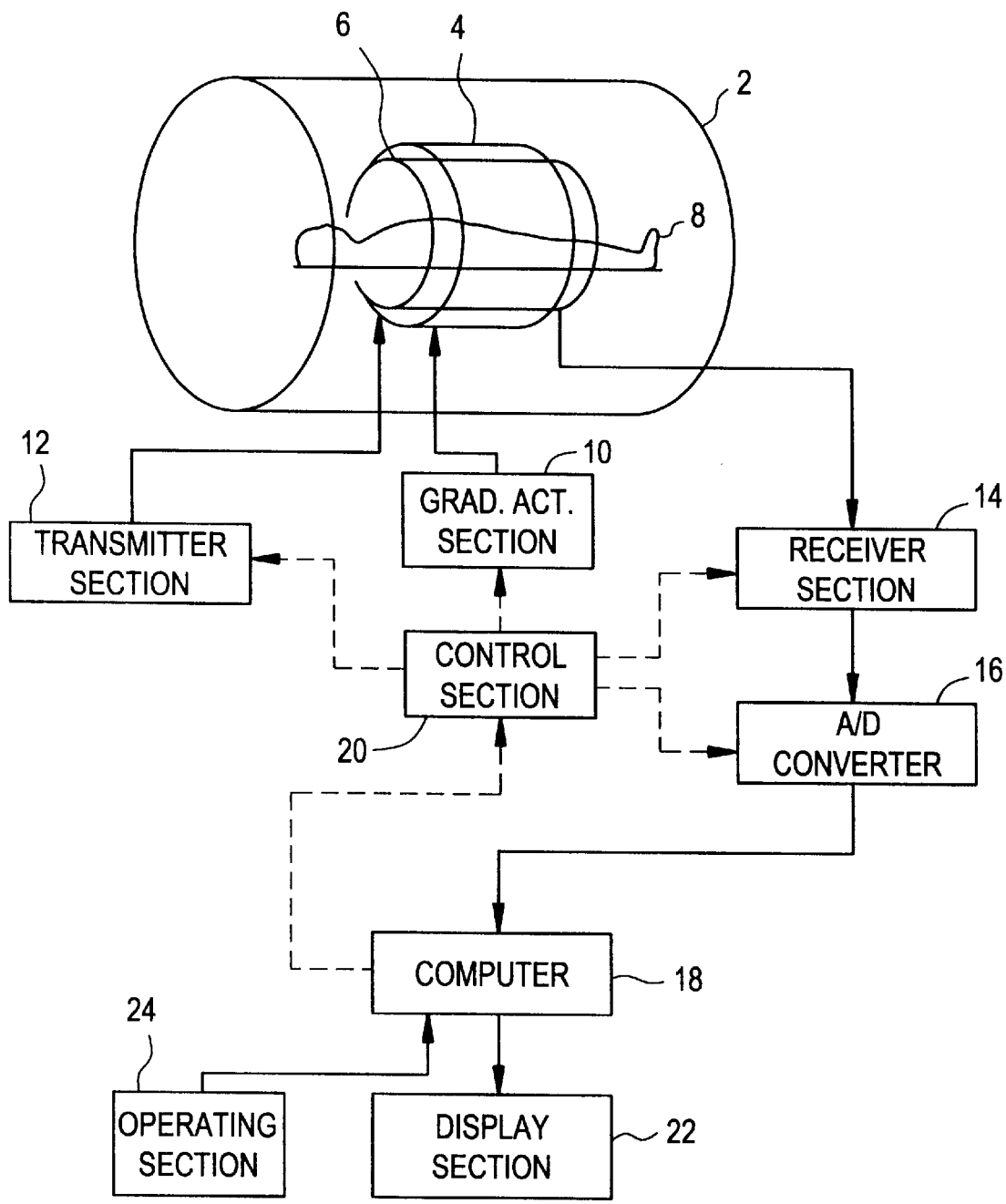
FIG. 1 is a block diagram of an apparatus in accordance with one embodiment of the present invention.

The embodiments of the present invention will now be described in more detail with reference to the accompanying drawings. FIG. 1 is a block diagram of a magnetic resonance imaging apparatus which is one embodiment of the present invention. The configuration of the apparatus represents one embodiment of an apparatus in accordance with the present invention, and the operation of the apparatus represents one embodiment of a method in accordance with the present invention.

(Configuration)

The configuration of the magnetic resonance imaging apparatus will now be described. As shown in FIG. 1, the apparatus comprises a generally cylindrical static magnetic field generating section 2 for generating a homogeneous static magnetic field (main magnetic field) in its internal space. Within the static magnetic field generating section 2 are disposed a generally cylindrical gradient coil section 4 and a generally cylindrical body coil section 6, both of which have a common center axis. A subject 8 is placed in a generally cylindrical space formed within the body coil 6 by carrying means (not shown).

The gradient coil section 4 is connected with a gradient activating section 10 for supplying an activation signal to the gradient coil section 4 to generate a gradient magnetic field. The gradient magnetic field to be generated consists of three types of gradient magnetic field, i.e., slice gradient magnetic field, readout gradient magnetic field and phase encoding gradient magnetic field.

The body coil section 6 is connected with a transmitter section 12 for supplying an activating signal (i.e., RF (radio frequency) signal) to the body coil section 6 to generate an RF magnetic field, thereby exciting spins within the subject 8.

A magnetic resonance signal generated by the excited spins are picked up by the body coil section 6. The body coil section 6 is connected with a receiver section 14 for receiving the signal picked up by the body coil section 6.

The receiver section 14 is connected with an analog-to-digital (A–D) converter section 16 for converting an output signal from the receiver section 14 into a digital signal.

The digital signal from the A–D converter section 16 is supplied to a computer 18, and the computer 18 stores the signal in a memory (not shown). A data space is thus formed in the memory. The data space constitutes a two-dimensional Fourier space. The computer 18 performs two-dimensional inverse Fourier transformation on the data in the two-dimensional Fourier space to reconstruct an image of the subject 8.

The computer 18 is connected with a control section 20, and the control section 20 is connected with the gradient activating section 10, the transmitter section 12, the receiver section 14 and the A–D converter section 16. The control section 20 controls these sections 10–16 based on commands supplied from the computer 18.

The computer 18 is also connected with a display section 22 and an operating section 24. The display section 22 presents various information including the reconstructed image output from the computer 18. The operating section 24 is manipulated by an operator and supplies several commands and information to the computer 18.

(Operation)

The operation of the apparatus will now be described. Imaging is carried out under the control of the control section 20. The imaging is described with reference to a gradient echo technique as a specific example of magnetic resonance imaging. The gradient echo technique employs a pulse sequence as exemplarily shown in FIG. 2.

Figure 2:
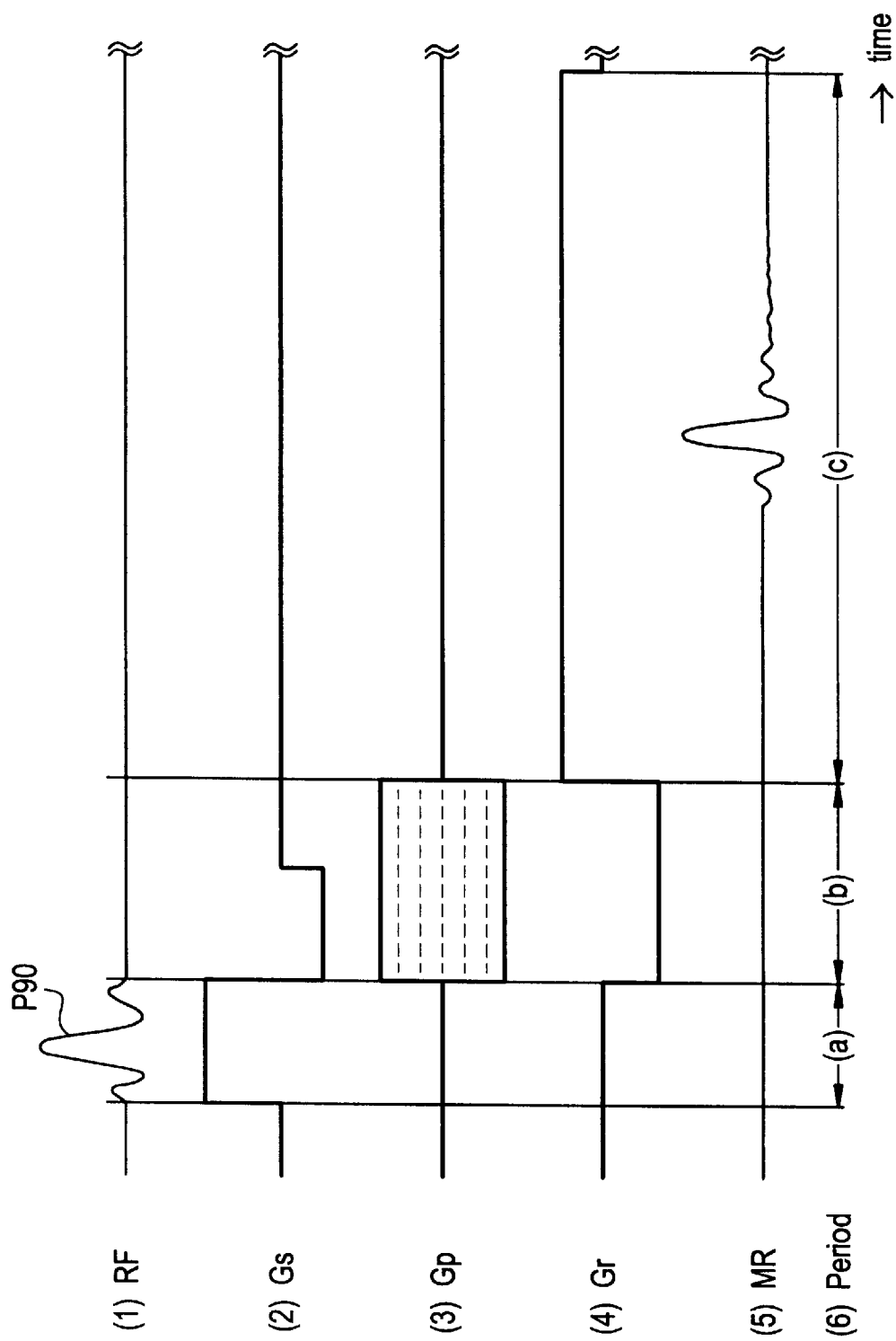
FIG. 2 is a time chart illustrating an exemplary pulse sequence used for imaging by the apparatus.

FIG. 2 is a schematic representation of the pulse sequence for acquiring a magnetic resonance signal (gradient echo signal) for one view. This pulse sequence is repeated, for example, 256 times in a cycle of 1TR to acquire gradient echo signals for 256 views.

The execution of the pulse sequence and the acquisition of the gradient echo signals are governed by the control section 20. Obviously, the imaging technique is not limited to the gradient echo technique, and may be conducted with other techniques such as a spin-echo technique.

As shown in FIG. 2(6), the pulse sequence is divided into three periods (a)–(c) along the time axis. First, RF excitation is achieved by a 90° pulse P90 as shown in (1) in the period (a). The RF excitation is conducted by the body coil section 6 activated by the transmitter section 12.

At the same time, a slice gradient magnetic field Gs is applied as shown in (2). The application of the slice gradient magnetic field Gs is conducted by the gradient coil section 4 activated by the gradient activating section 10. The spins in a predefined slice through the subject 8 are thus excited (selective excitation).

Then, a phase encoding gradient magnetic field Gp is applied as shown in (3) in the period (b). The application of the phase encoding gradient magnetic field Gp is also conducted by the gradient coil section 4 activated by the gradient activating section 10. The spins are thus phase-encoded.

The spins are rephased by the slice gradient magnetic field Gs shown in (2) in the phase encoding period. In addition, a readout gradient magnetic field Gr is applied as shown in (4) to dephase the spins. The application of the readout gradient magnetic field Gr is also conducted by the gradient coil section 4 activated by the gradient activating section 10.

Next, the readout gradient magnetic field Gr is applied as shown in (4) in the period (c), thereby generating a gradient echo signal MR from the subject 8 as shown in (5).

The gradient echo signal MR is received by the body coil section 6. The received signal is supplied to the computer 18 via the receiver section 14 and the A–D converter section 16. The computer 18 stores the supplied signal in the memory as measured data. Gradient echo data for one view is thus acquired in the two-dimensional Fourier space in the memory.

The above operation is repeated, for example, 256 times in a cycle of 1TR. The phase encoding gradient magnetic field Gp is varied for each repetition of the operation to provide different phase encodings among the repetitions. This is indicated by broken lines at the waveform in FIG. 2(3).

Figure 3:
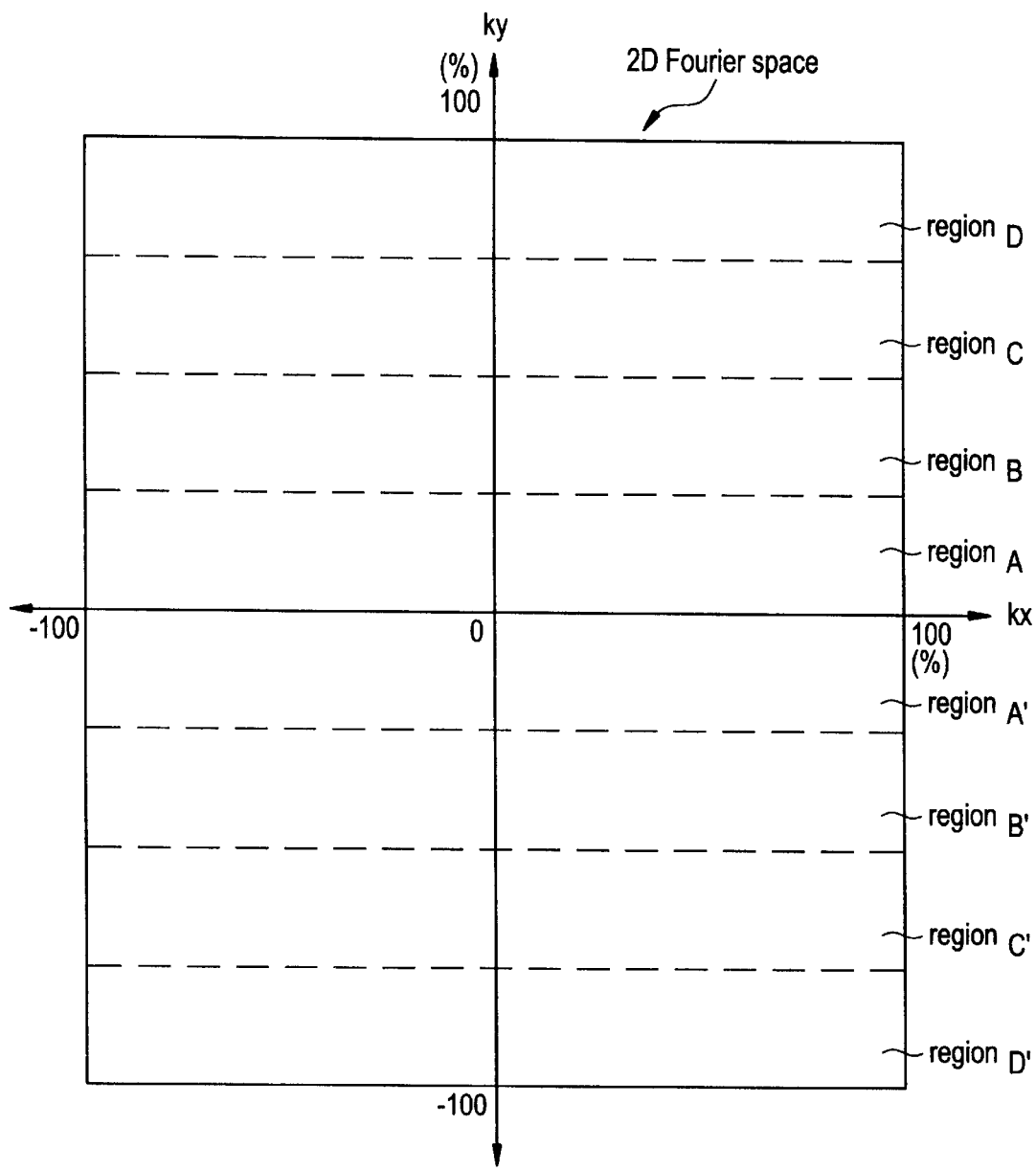

Referring now to FIG. 3, there is shown a conceptual diagram of the two-dimensional Fourier space, sometimes referred to as a "k-space", formed in the memory. As shown in FIG. 3, the two-dimensional Fourier space has two coordinate axes kx and ky orthogonal to each other. The kx axis represents the frequency axis, and the ky axis represents the phase axis. The two-dimensional Fourier space ranges from +100%–100% along both of the axes.

The two-dimensional Fourier space is divided into eight regions in the direction of the phase axis ky symmetrically with respect to an axis of ky=0, or the frequency axis kx, i.e., into regions A, A', B, B', C, C', D and D'. Each set of the regions A and A', B and B', C and C', and D and D' constitutes a pair of regions which are symmetric with each other.

The set of the regions A and A' is a region pair which is nearest to the frequency axis kx and the regions are referred to as "central regions" hereinafter. The regions A and A' represent an example of the central regions in accordance with the present invention. The other regions B and B', C and C', and D and D' are located in order on the periphery of the regions A and A', and they represent an example of peripheral regions in accordance with the present invention.

Preferably, the two-dimensional Fourier space is equally divided into the regions A, A'–D, D' in that the time phases of a plurality of reconstructed images as will be described later are equally spaced. However, the two-dimensional Fourier space need not be equally divided when unequally spaced time phases are allowed. Moreover, the number of division is not limited to eight, and may be any even number that is equal to or greater than six. The division is conducted by the computer 18.

Figure 5:
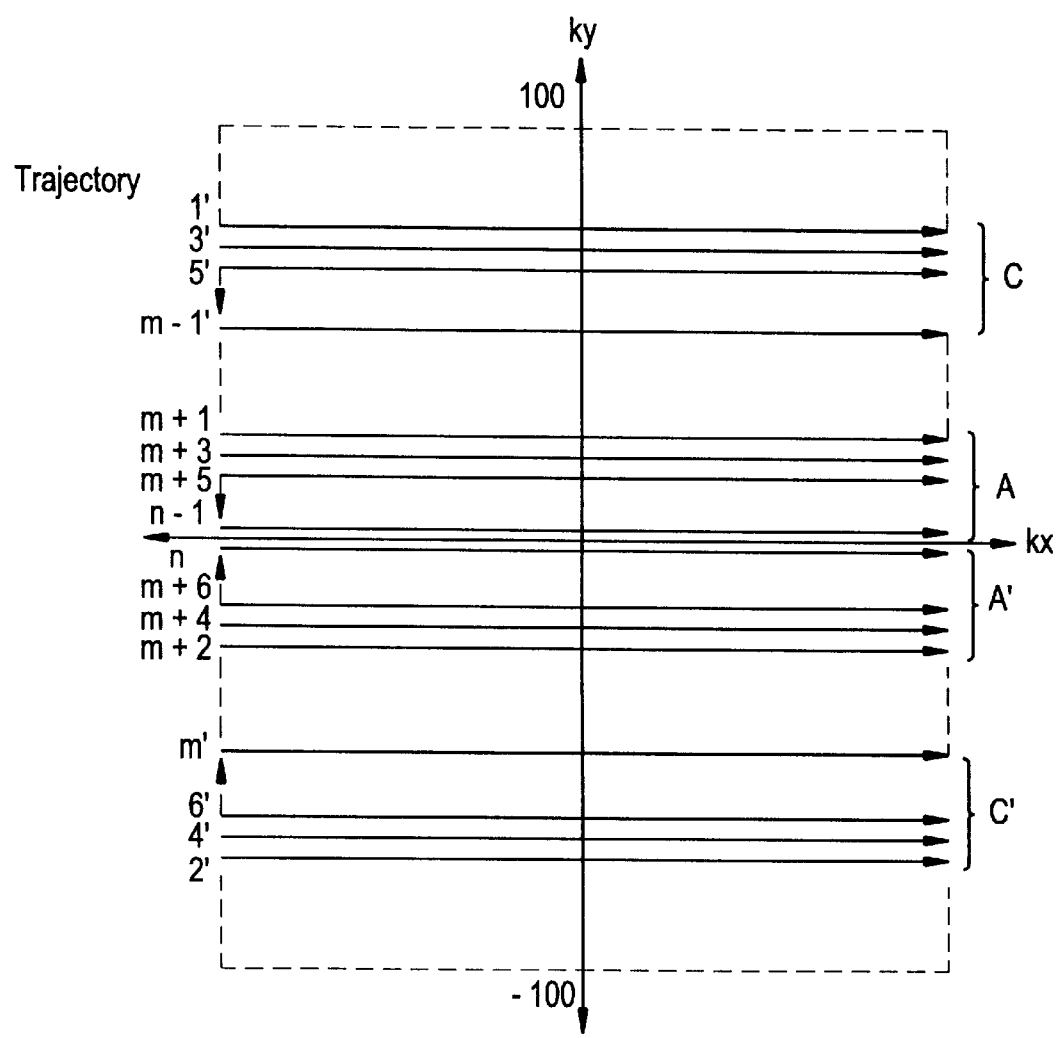
FIG. 5 is a schematic diagram illustrating data acquisitions for the two-dimensional Fourier space by the apparatus.
Figure 6:
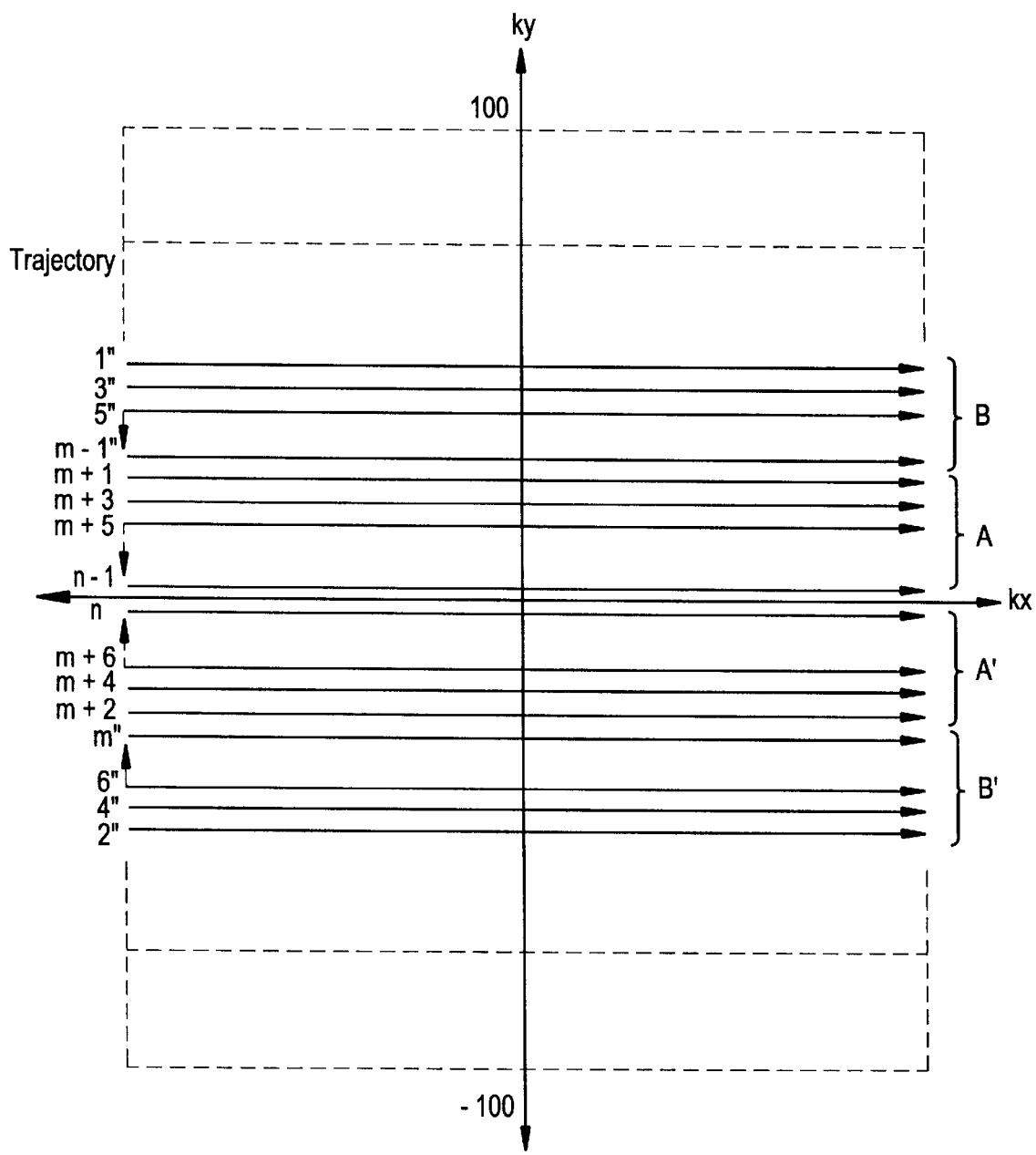
FIG. 6 is a schematic diagram illustrating an exemplary division of a two-dimensional Fourier space by the apparatus.

The computer 18 conducts data acquisitions for the two-dimensional Fourier space thus divided in a specific order as exemplarily described below. Examples of data acquisition trajectories for the two-dimensional Fourier space are shown in FIGS. 4–6.

Figure 4:
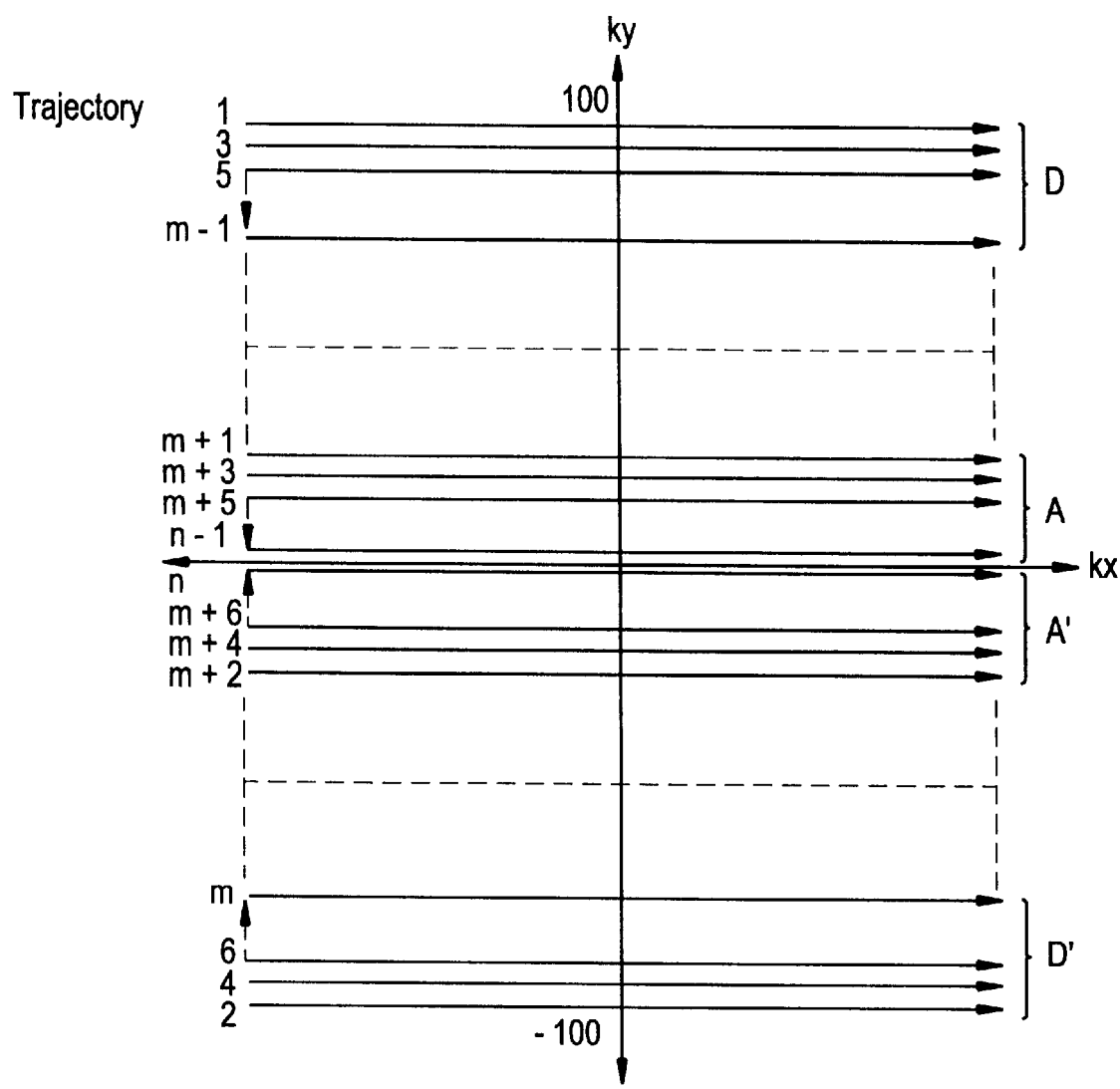
FIG. 4 is a schematic diagram illustrating data acquisitions for the two-dimensional Fourier space by the apparatus.

First, view data (referred to simply as "data" hereinafter) are acquired along trajectories as shown in FIG. 4. That is, data having a phase encoding amount of +100% is first acquired along a trajectory 1. The trajectory 1 belongs to the peripheral region D. Next, data having a phase encoding amount of −100% is acquired along a trajectory 2. The trajectory 2 belongs to the peripheral region D'.

The trajectories 1 and 2 are located at positions in the two-dimensional Fourier space at which the phase encoding amounts have the same absolute value but opposite signs. The time difference between the data acquired for the trajectories 1 and 2 is 1TR. A time difference of 1TR is the minimum value of the time difference between the data acquired by the present apparatus. For example, 1TR is equal to 20 ms. That is, data having a time difference of, for example, 20 ms are acquired at positions which are symmetric with each other in the phase axis direction in the two-dimensional Fourier space. The data may be safely considered as data of the substantially same time phase.

Next, data having a phase encoding amount one-step smaller than +100% is acquired along a trajectory 3 which belongs to the peripheral region D. Then, data having a phase encoding amount one-step smaller than −100% is acquired along a trajectory 4 which belongs to the peripheral region D'. The trajectories 3 and 4 are located at positions in the two-dimensional Fourier space at which the phase encoding amounts have the same absolute value but opposite signs. The time difference between the data acquired for the trajectories 3 and 4 is 1TR.

Thereafter, data are acquired alternately at symmetric positions in the peripheral regions D and D' in a similar manner. Therefore, each of time differences between the data acquired at the symmetric positions in the peripheral regions D and D' is 1TR.

When the data acquisitions for the peripheral regions D and D' are completed at a trajectory m, data acquisitions for the central regions A and A' are started. That is, data having the maximum positive phase encoding amount in the central region A is acquired along a trajectory m+1 which belongs to the central region A, and then data having the maximum negative phase encoding amount in the central region A' is acquired along a trajectory m+2 which belongs to the central region A'.

Next, data having a phase encoding amount one-step smaller than the maximum positive phase encoding amount in the central region A is acquired along a trajectory m+3 which belongs to the central region A, and then data having a phase encoding amount one-step smaller than the maximum negative phase encoding amount in the central region A' is acquired along a trajectory m+4 which belongs to the central region A'. Thereafter, data are successively acquired at symmetric positions in the central regions A and A' in a similar manner until trajectories n-1 and n adjacent to the axis of ky=0 are reached. Again, each of the time differences between the data for the symmetric positions in the central regions A and A' is 1TR.

Then, data are acquired along trajectories as shown in FIG. 5. That is, data having the maximum positive phase encoding amount in the peripheral region C is acquired along a trajectory 1' which belongs to the peripheral region C, and then data having the maximum negative phase encoding amount in the peripheral region C' is acquired along a trajectory 2' which belongs to the peripheral region C'.

The trajectories 1' and 2' are located at positions in the two-dimensional Fourier space at which the phase encoding amounts have the same absolute value but opposite signs. The time difference between the data acquired for the trajectories 1' and 2' is 1TR.

Next, data having a phase encoding amount one-step smaller than the maximum positive phase encoding amount in the peripheral region C is acquired along a trajectory 3' which belongs to the peripheral region C. And then, data having a phase encoding amount one-step smaller than the maximum negative phase encoding amount in the peripheral region C' is acquired along a trajectory 4' which belongs to the peripheral region C'. The trajectories 3' and 4' are located at positions in the two-dimensional Fourier space at which the phase encoding amounts have the same absolute value but opposite signs. The time difference between the data acquired for the trajectories 3' and 4' is 1TR.

Thereafter, data are acquired alternately at symmetric positions in the peripheral region C and C' in a similar manner. Therefore, each of time differences between the data acquired at the symmetric positions in the peripheral regions C and C' is 1TR.

When the data acquisitions for the peripheral regions C and C' are completed at a trajectory m', data acquisitions for the central regions A and A' are started. The data acquisitions for the central regions A and A' are carried out in a similar manner as described before. Therefore, each of the time differences between the data at the symmetric positions in the central regions A and A' is 1TR. However, the data for the central regions A and A' acquired at this time are stored in the memory separately from the previously acquired data for the central regions A and A'.

Then, data are acquired along trajectories as shown in FIG. 6. That is, data having the maximum positive phase encoding amount in the peripheral region B is acquired along a trajectory 1" which belongs to the peripheral region B, and then data having the maximum negative phase encoding amount in the peripheral region B' is acquired along a trajectory 2" which belongs to the peripheral region B'.

The trajectories 1" and 2" are located at positions in the two-dimensional Fourier space at which the phase encoding amounts have the same absolute value but opposite signs. The time difference between the data acquired for the trajectories 1" and 2" is 1TR.

Next, data having a phase encoding amount one-step smaller than the maximum positive phase encoding amount in the peripheral region B is acquired along a trajectory 3" which belongs to the peripheral region B. And then, data having a phase encoding amount one-step smaller than the maximum negative phase encoding amount in the peripheral region B' is acquired along a trajectory 4" which belongs to the peripheral region B'. The trajectories 3" and 4" are located at positions in the two-dimensional Fourier space at which the phase encoding amounts have the same absolute value but opposite signs. The time difference between the data acquired for the trajectories 3" and 4" is 1TR.

Thereafter, data are acquired alternately at symmetric positions in the peripheral region B and B' in a similar manner. Therefore, each of time differences between the data acquired at the symmetric positions in the peripheral regions B and B' is 1TR.

When the data acquisitions for the peripheral regions B and B' are completed at a trajectory m", data acquisitions for the central regions A and A' are started. The data acquisitions for the central regions A and A' are carried out in a similar manner as described before. Therefore, each of the time differences between the data at the symmetric positions in the central regions A and A' is 1TR. However, the data for the central regions A and A' acquired at this time are stored in the memory separately from the previously acquired data for the central regions A and A'.

Then, the process returns to the data acquisitions as shown in FIG. 4, and thereafter the data acquisitions as shown in FIGS. 5 and. 6 are conducted; and the entire process is repeatedly executed. The data acquired for the repetitions are stored in respective regions in the memory.

Figure 7:
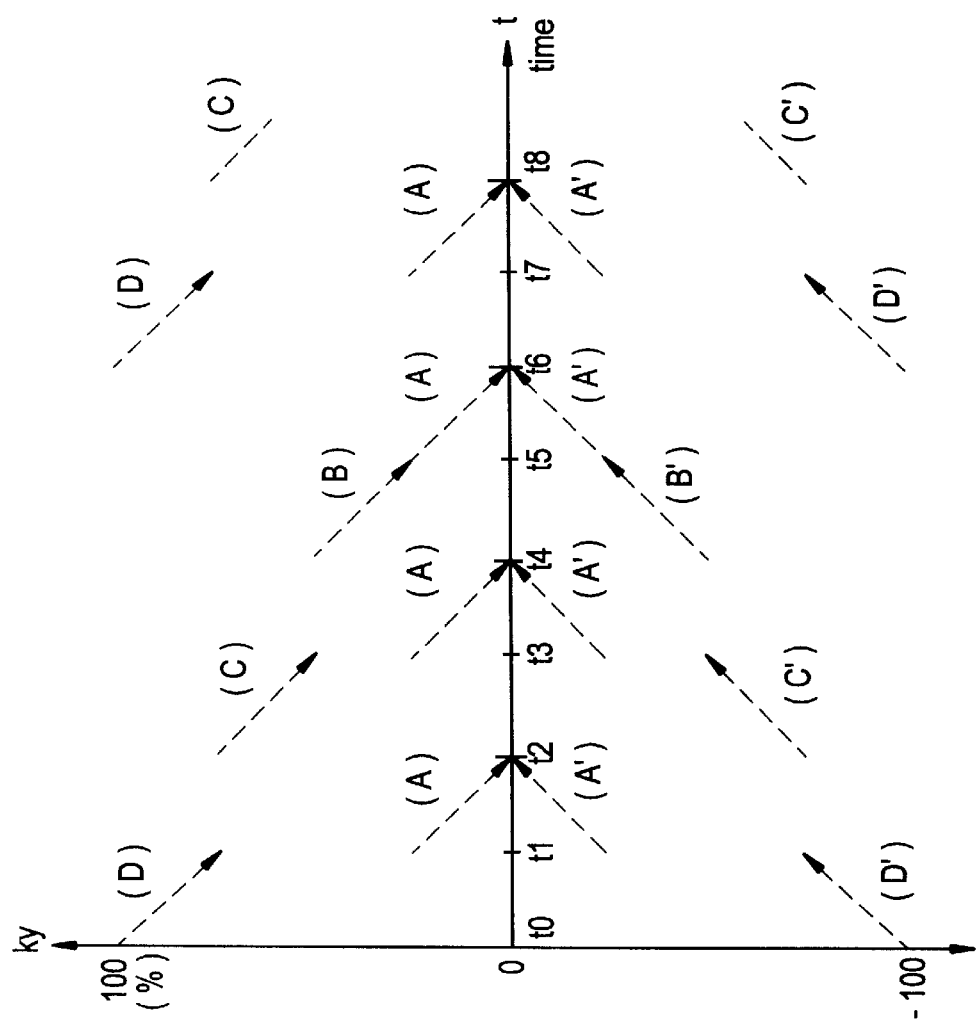
FIG. 7 is a time chart of the data acquisitions by the apparatus.

FIG. 7 illustrates the above-described data acquisition process in time order, in which the vertical axis represents the phase encoding amount and the horizontal axis represents the time. As shown in FIG. 7, the data acquisition for the peripheral regions D and D' is alternately conducted for each TR in a period of time t0–t1, the data acquisition for the central regions A and A' is alternately conducted for each TR in a period of time t1–t2, the data acquisition for the peripheral regions C and C' is alternately conducted for each TR in a period of time t2–t3, the data acquisition for the central regions A and A' is alternately conducted for each TR in a period of time t3–t4, the data acquisition for the peripheral regions B and B' is alternately conducted for each TR in a period of time t4–t5, and the data acquisition for the central regions A and A' is alternately conducted for each TR in a period of time t5–t6; and the entire process is repeatedly executed.

In other words, the data acquisitions for the plurality of peripheral regions B and B', C and C', and D and D' are sequentially conducted with the data acquisition for the central regions A and A' interposed each time. Thus, the time difference between the data acquisition time periods of the central regions A and A' is reduced. Moreover, the time difference between the data at symmetric positions in the phase axis direction is 1TR in each pair of the regions.

Figure 8:
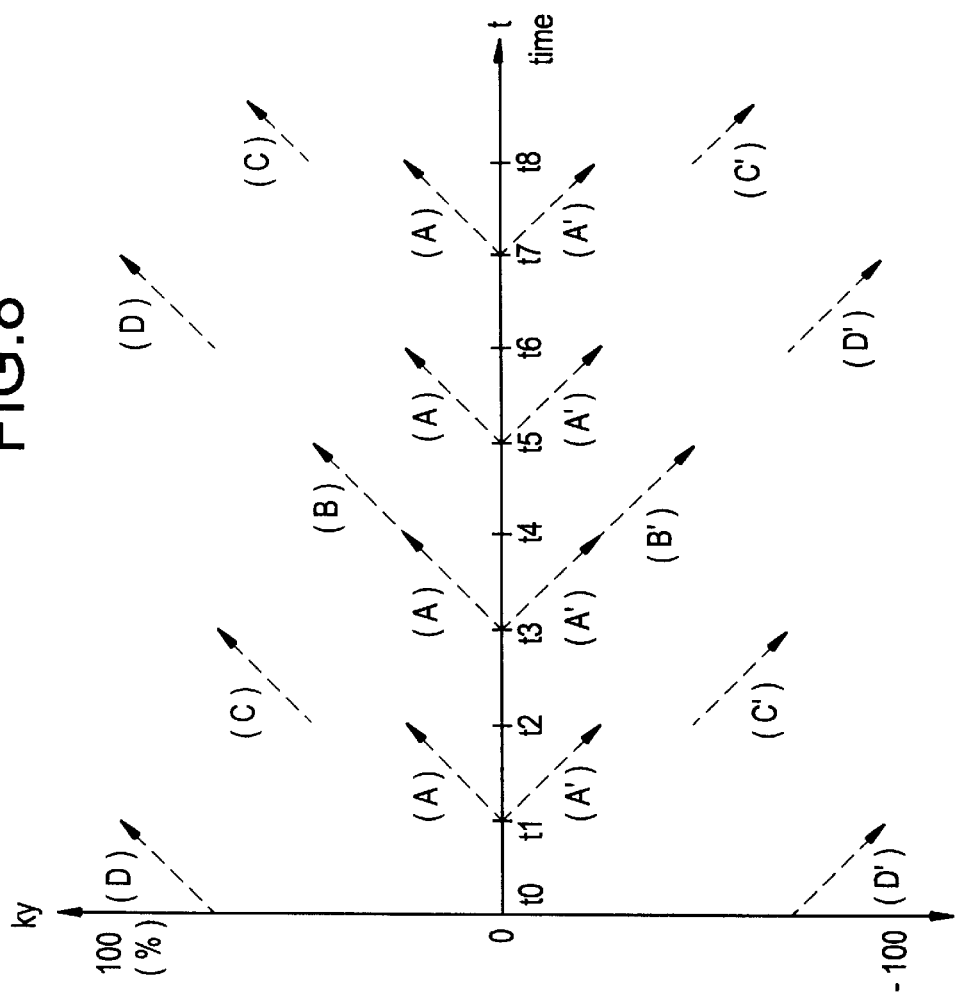
FIG. 8 is another time chart of data acquisitions by the apparatus.

Although the data acquisition for each region is described in the above description as proceeding such that the phase encoding amount steps from the largest value to the smallest value in each region, it is obvious that the data acquisition may proceed such that the phase encoding amount steps from the smallest value to the largest value, as exemplarily shown in FIG. 8.

Figure 9:
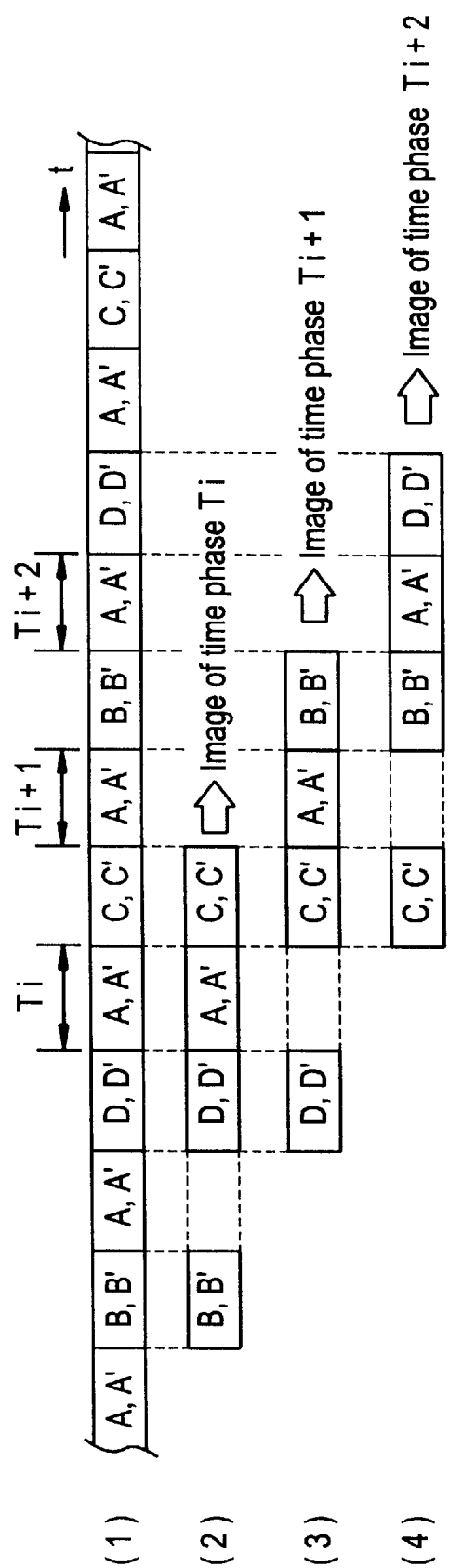
FIG. 9 is a schematic diagram illustrating image reconstruction by the apparatus.

The computer 18 sequentially reconstructs images of a plurality of time phases based on the data acquired in the memory through the above-described operation. FIG. 9 illustrates the relationship between the acquired data and the images to be reconstructed. FIG. 9(1) represents the data of the regions acquired in time order. Considering the data of the central regions A and A' acquired in a time period Ti, the image reconstruction is conducted using the data of the central regions A and A' acquired in the time period Ti and the data of the peripheral regions B and B', C and C', and D and D' acquired in preceding and succeeding time periods that are nearest to the time period Ti as shown in FIG. 9(2).

The data of the peripheral regions C and C' and D and D' are those acquired respectively in the succeeding and preceding time periods adjacent to the time period Ti. The acquisition time period of the data of the peripheral regions B and B' is not adjacent to, but nearest to the time period Ti. Either of the data of the peripheral regions B and B' before the time period Ti or after the time period Ti may be used because their time differences relative to the time period Ti are the same.

The image reconstructed using such data is substantially an image of the state of the subject 8 in the time period Ti, i.e., of the time phase Ti, because the data of the central regions A and A' are acquired in the time period Ti.

Another image reconstruction is then conducted using the data of the central regions A and A' acquired in a time period Ti+1 and the data of the peripheral regions B and B', C and C', and D and D' acquired in respective time periods that are nearest to the time period Ti+1 as shown in FIG. 9(3). An image substantially of a time phase Ti+1 is thus obtained.

Then, still another image reconstruction is conducted using the data of the central regions A and A' acquired in a time period Ti+2 and the data of the peripheral regions B and B', C and C', and D and D' acquired in respective time periods that are nearest to the time period Ti+2 as shown in FIG. 9(4). An image substantially of a time phase Ti+2 is thus obtained.

Thereafter, the image reconstruction is conducted in a similar manner using the data of the central regions A and A' acquired in a certain time period and the data of the peripheral regions B and B', C and C', and D and D' acquired in respective time periods that are nearest to the certain time period, thereby producing images of time phases of data acquisition time periods of the central regions A and A'.

Since the data acquisitions are sequentially conducted by acquiring data for the plurality of peripheral regions with the data acquisition for the central regions A and A' interposed each time, the time difference is reduced between the time phases at which the data of the central regions A and A' are acquired. Thus, the plurality of images sequentially reconstructed indicate the state of the subject 8 in finely spaced time phases.

Moreover, since each time difference between the data at positions which are symmetric with each other in the phase axis direction is 1TR for each pair of regions, any motion of the subject 8 affects the data equally in the phase axis direction. Accordingly, symmetry of data holds in the two-dimensional Fourier space, thereby avoiding artifacts in the reconstructed images.

The present apparatus thus operated may be effectively applied to various purposes, including an application in which an image of the internal tissues of the elbow or knee joint is captured while bending the elbow or knee, an application in which dynamics of a contrast agent injected into the blood vessel is imaged, or an application in which the movement of a stabbed needle for biopsy etc. is imaged.

Figure 10:
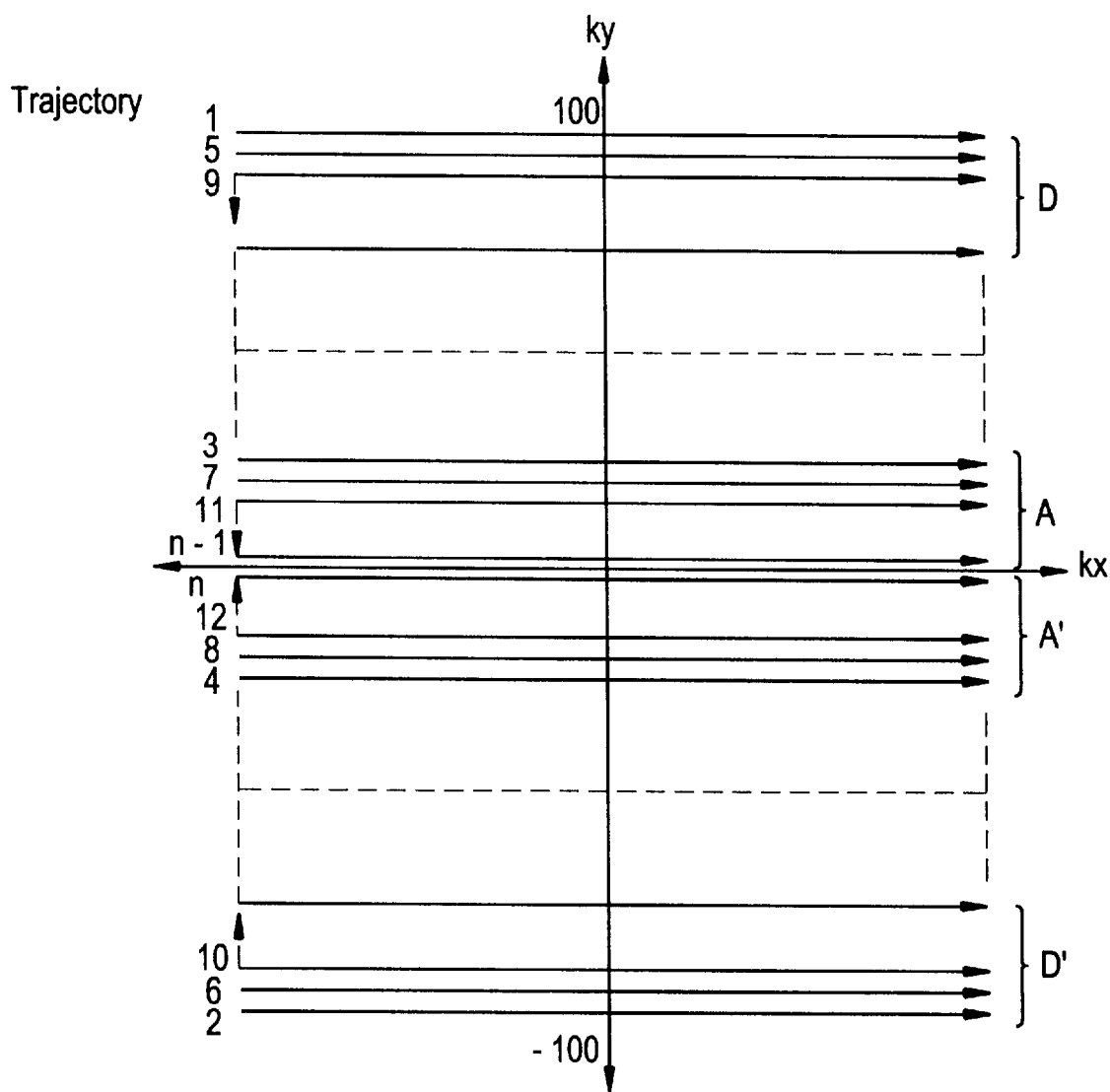
FIG. 10 is a schematic diagram illustrating data acquisitions for the two-dimensional Fourier space by the apparatus.

Although the data acquisitions for the central regions A and A' and the peripheral regions B and B', C and C', and D and D' are described as being conducted in regional order in the above description, the data acquisitions may be conducted with acquisitions for a pair of peripheral regions and acquisitions for a pair of central regions interleaved. That is, as exemplarily shown in FIG. 10, the data acquisitions are conducted in order, first, for trajectories 1 and 2 in the peripheral regions D and D'; next, for trajectories 3 and 4 in the central regions A and A'; next, for trajectories 5 and 6 inside the trajectories 1 and 2 in the peripheral regions D and D'; next, for trajectories 7 and 8 inside the trajectories 3 and 4 in the central regions A and A', and so forth. The data acquisitions are thus conducted for each trajectory pair alternately in the peripheral regions D and D' and in the central regions A and A'. The data acquisitions for the peripheral regions B and B' and C and C' are similarly conducted.

Figure 11:
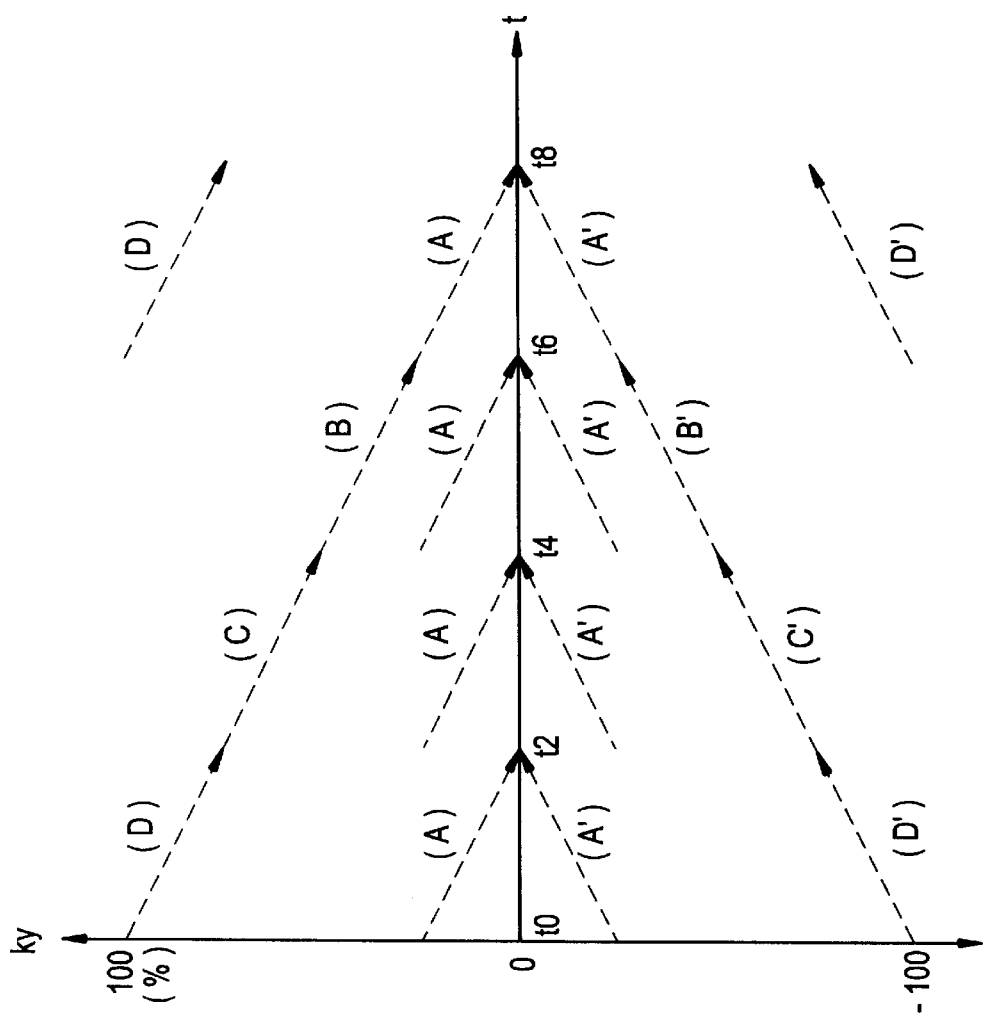
FIG. 11 is a time chart of the data acquisitions by the apparatus.
Figure 12:
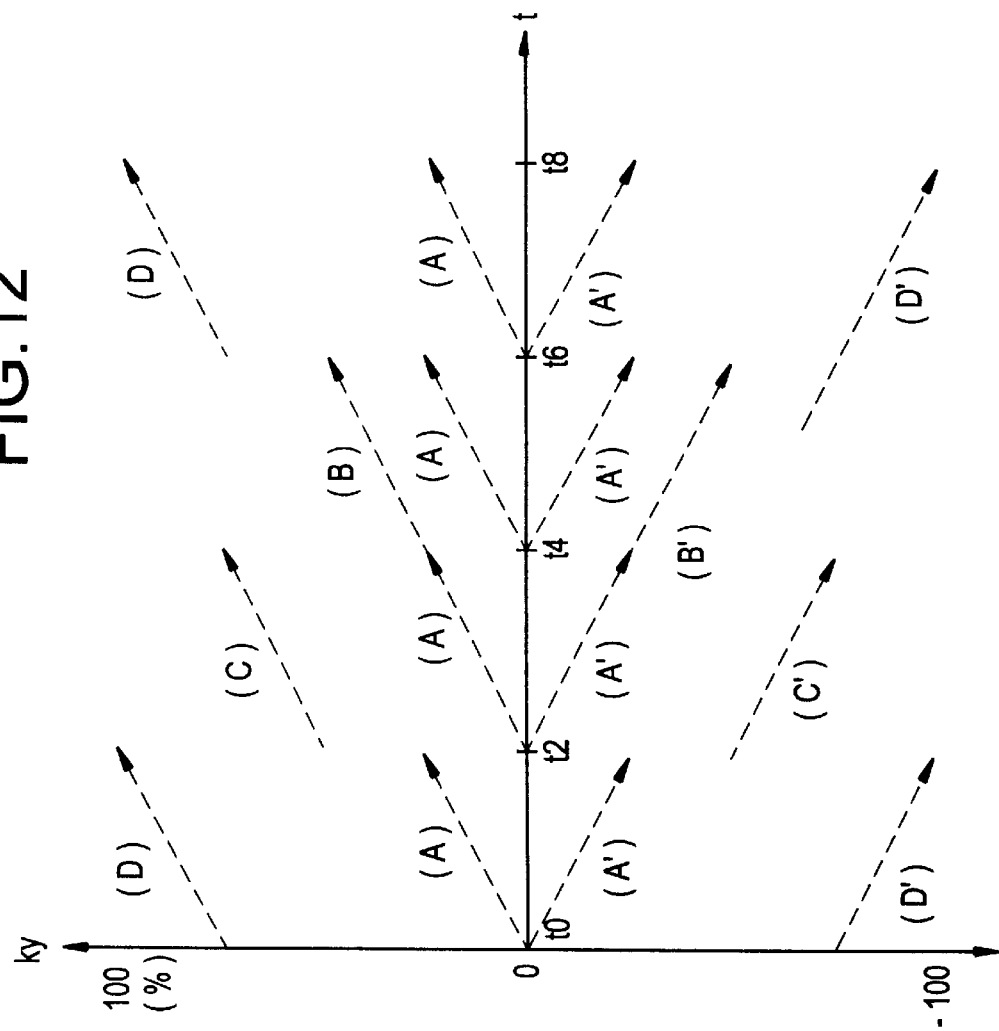
FIG. 12 is another time chart of data acquisitions by the apparatus.

FIG. 11 illustrates the above-described operation in time order. As shown, the data acquisition for the peripheral regions D and D' and the data acquisition for the central regions A and A' are conducted in a interleaved manner in a period of time t0–t2, the data acquisition for the peripheral regions C and C' and the data acquisition for the central regions A and A' are conducted in a interleaved manner in a period of time t2–t4, and the data acquisition for the peripheral regions B and B' and the data acquisition for the central regions A and A' are conducted in a interleaved manner in a period of time t4–t6. The entire process is repeatedly executed thereafter. Obviously, the data acquisitions may be conducted from a point nearer to the frequency axis toward a point farther to the frequency axis as shown in FIG. 12.

By such data acquisitions, the data in time order as shown in FIG. 13(1) are obtained. As shown, the data acquisitions for the peripheral regions B and B', C and C', and D and D' are conducted sequentially, while the data acquisition for the central regions A and A' is conducted continuously. The image reconstruction based on the data thus acquired is conducted, for example, in a manner shown in FIG. 13(2)–(4).

That is, an image of a time phase Tj is reconstructed using the data of the central regions A and A' acquired in a time period Tj and the data of the peripheral regions B and B', C and C', and D and D' acquired in time periods before, after, and identical to the time period Tj, respectively, as shown in FIG. 13(2); an image of a time phase Tj+1 is reconstructed using the data of the central regions A and A' acquired in a time period Tj+1 and the data of the peripheral regions B and B', C and C', and D and D' acquired in time periods after, identical to, and before the time period Tj+1, respectively, as shown in FIG. 13(3); and an image of a time phase Tj+2 is reconstructed using the data of the central regions A and A' acquired in a time period Tj+2 and the data of the peripheral regions B and B', C and C', and D and D' acquired in time periods identical to, before, and after the time period Tj+2, respectively, as shown in FIG. 13(4). The image reconstructions are conducted in a similar manner thereafter. The plurality of images thus reconstructed are preferable in that the time phases thereof are continuous.

Although the above description is made with reference to a magnetic resonance imaging apparatus which employs a horizontal magnetic field, it is obvious that the apparatus may employ a so-called vertical magnetic field in which the direction of a static magnetic field is orthogonal to the body axis of a subject.

Moreover, although the above description refers to an example in which data for one view is acquired for 1TR, it is obvious that the present invention is not limited thereto but may be applied to the case in which data for a plurality of views are acquired for 1TR. Furthermore, the present invention may be applied to an EPI (echo planar imaging) technique.

Many widely different embodiments of the invention may be configured without departing from the spirit and the scope of the present invention. It should be understood that the present invention is not limited to the specific embodiments described in the specification, except as defined in the appended claims.

What is claimed is:

1. A magnetic resonance imaging method comprising the steps of:

dividing a two-dimensional Fourier space into a plurality of regions which are symmetric with respect to a frequency axis which corresponds to a direct current component;

repeatedly conducting an alternate acquisition of magnetic resonance signals for a pair of central regions which are symmetric with each other and are nearest to the frequency axis of the plurality of regions, and an alternate acquisition of magnetic resonance signals for a selected one of a plurality of pairs of peripheral regions other than the pair of central regions which are symmetric with each other, with the selected pair of peripheral regions switched in order from one pair to another for each repetition; and sequentially reconstructing an image using a set of magnetic resonance signals consisting of the magnetic resonance signals acquired for the pair of central regions for one of the repetitions and the respective magnetic resonance signals for the plurality of pairs of peripheral regions-acquired at respective time points nearest to a data acquisition time point of the pair of central regions for that repetition.

2. A magnetic resonance imaging apparatus comprising:

region defining means for dividing a two-dimensional Fourier space into a plurality of regions which are symmetric with respect to a frequency axis which corresponds to a direct current component;

magnetic resonance signal acquiring means for repeatedly conducting an alternate acquisition of magnetic resonance signals for a pair of central regions which are symmetric with each other and are nearest to the frequency axis of the plurality of regions, and an alternate acquisition of magnetic resonance signals for a selected one of a plurality of pairs of peripheral regions other than the pair of central regions which are symmetric with each other, with the selected pair of peripheral regions switched in order from one pair to another for each repetition; and image reconstructing means for sequentially reconstructing an image using a set of magnetic resonance signals consisting of the magnetic resonance signals acquired for the pair of central regions for one of the repetitions and the respective magnetic resonance signals for the plurality of pairs of peripheral regions acquired at respective time points nearest to a data acquisition time point of the pair of central regions for that repetition.

3. The magnetic resonance imaging apparatus of claim 2, wherein the magnetic resonance signal acquiring means acquires the magnetic resonance signals at positions which are symmetric with respect to the frequency axis alternately for the pairs of central regions and for the plurality of pairs of peripheral regions.

4. The magnetic resonance imaging apparatus of claim 3, wherein the magnetic resonance signal acquiring means repeatedly conducts an alternate acquisition of magnetic resonance signals for the pair of central regions to acquire all magnetic resonance signals for the pair of central regions, and then conducts an alternate acquisition of magnetic resonance signals for a selected one of the plurality of pairs of peripheral regions to acquire all magnetic resonance signals for the selected pair of peripheral regions.

5. The magnetic resonance imaging apparatus of claim 3, wherein the magnetic resonance signal acquiring means repeatedly conducts an alternate acquisition of magnetic resonance signals for the pair of central regions and a selected one of the plurality of pairs of peripheral regions to acquire all magnetic resonance signals for the pair of central regions and the selected pair of peripheral regions.

* * * * *